United States Patent
Kitagawa et al.

(10) Patent No.: US 9,376,581 B2
(45) Date of Patent: Jun. 28, 2016

(54) PHOTO-CURABLE COMPOSITION FOR IMPRINTS, PATTERN FORMING METHOD AND PATTERN

(71) Applicant: FUJIFILM Corporation, Minato-ku, Tokyo (JP)

(72) Inventors: Hirotaka Kitagawa, Haibara-gun (JP); Masafumi Yoshida, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 14/483,860

(22) Filed: Sep. 11, 2014

(65) Prior Publication Data

US 2014/0374884 A1 Dec. 25, 2014

Related U.S. Application Data

(63) Continuation of application No. PCT/JP2013/051563, filed on Jan. 25, 2013.

(30) Foreign Application Priority Data

Mar. 13, 2012 (JP) ................................. 2012-056158

(51) Int. Cl.

| | | |
|---|---|---|
| C08F 2/46 | (2006.01) |
| C08F 2/50 | (2006.01) |
| C08G 61/04 | (2006.01) |
| C09D 11/101 | (2014.01) |
| C08F 220/18 | (2006.01) |
| C08F 236/20 | (2006.01) |
| C08F 2/48 | (2006.01) |
| G03F 7/00 | (2006.01) |
| G03F 7/004 | (2006.01) |
| G03F 7/027 | (2006.01) |
| B05D 5/00 | (2006.01) |
| B29C 59/00 | (2006.01) |
| B29C 59/16 | (2006.01) |
| H01L 21/027 | (2006.01) |
| H01L 21/308 | (2006.01) |
| B29K 33/00 | (2006.01) |
| C08F 220/58 | (2006.01) |
| C08F 220/32 | (2006.01) |
| H01L 21/311 | (2006.01) |

(52) U.S. Cl.
CPC ............... *C09D 11/101* (2013.01); *B05D 5/00* (2013.01); *B29C 59/005* (2013.01); *B29C 59/16* (2013.01); *C08F 2/48* (2013.01); *C08F 220/18* (2013.01); *C08F 236/20* (2013.01); *G03F 7/0002* (2013.01); *G03F 7/0046* (2013.01); *G03F 7/027* (2013.01); *H01L 21/0274* (2013.01); *H01L 21/3086* (2013.01); *B29K 2033/12* (2013.01); *C08F 220/58* (2013.01); *C08F 2220/325* (2013.01); *H01L 21/31138* (2013.01); *H01L 21/31144* (2013.01); *Y10T 428/24802* (2015.01)

(58) Field of Classification Search
CPC ...... C09D 11/101; B05D 5/00; C08F 220/18; C08F 236/20; C08F 2/48; C08F 220/58; C08F 2222/1013; B29C 59/16; B29C 59/005; B29K 2033/12; H01L 21/0274; H01L 21/3086; G03F 7/0046; G03F 7/027; G03F 7/00002; Y10T 428/24802
USPC .................................. 522/182, 178, 1; 520/1
See application file for complete search history.

(56) References Cited

U.S. PATENT DOCUMENTS

| | | |
|---|---|---|
| 8,288,079 B2 | 10/2012 | Ogino et al. |
| 8,530,540 B2 | 9/2013 | Kodama |
| 2007/0160937 A1 | 7/2007 | Ogino et al. |
| 2010/0009287 A1* | 1/2010 | Kodama ..................... 430/270.1 |
| 2011/0236595 A1* | 9/2011 | Kodama et al. ............... 427/553 |
| 2013/0032971 A1 | 2/2013 | Omatsu et al. |
| 2014/0121292 A1 | 5/2014 | Kodama et al. |

FOREIGN PATENT DOCUMENTS

| | | |
|---|---|---|
| JP | 2006-509354 A | 3/2006 |
| JP | 2007-186570 A | 7/2007 |
| JP | 2007-523249 A | 8/2007 |
| JP | 2010-037541 A | 2/2010 |
| JP | 2010-186979 A | 8/2010 |
| JP | 2010-530641 A | 9/2010 |
| JP | 2010-258026 A | 11/2010 |

(Continued)

OTHER PUBLICATIONS

Communication from the International Searching Authority issued Sep. 25, 2014 in International Patent Application No. PCT/JP2013/051563.
International Search Report for PCT/JP2013/051563 dated Apr. 23, 2013.
Office Action dated Jun. 30, 2015 issued by the Japan Patent Office in corresponding Japanese Application No. 2012-056158.

(Continued)

*Primary Examiner* — Ling Choi
*Assistant Examiner* — Jessica E Whiteley
(74) *Attorney, Agent, or Firm* — Sughrue Mion, PLLC

(57) ABSTRACT

To provide a photo-curable composition for imprints which can ensure high ratio of mold filling and low defect density during mold releasing, and can provide a resist material with high etching durability. A photo-curable composition for imprints comprising a monofunctional monomer, a polyfunctional monomer and a photo-polymerization initiator, having a viscosity at 25° C. of 15 mPa·s or smaller, an Ohnishi parameter of 3.0 or smaller, and a crosslink density calculated by (Formula 1) of 0.6 mmol/cm$^3$ or larger;

Crosslink density={Σ(Ratio of mixing of polyfunctional monomer (parts by mass)*Number of functional groups of polyfunctional monomer/Molecular weight of polyfunctional monomer)}/Specific gravity.

10 Claims, No Drawings

(56) References Cited

FOREIGN PATENT DOCUMENTS

| | | |
|---|---|---|
| JP | 2010-262980 A | 11/2010 |
| JP | 2011-222732 A | 11/2011 |
| KR | 10 2011 0097810 A | 8/2011 |
| TW | 201040233 A | 11/2010 |
| WO | 2004/051714 A2 | 6/2004 |
| WO | 2005/082992 A1 | 9/2005 |
| WO | 2008/156750 A1 | 12/2008 |
| WO | 2010/064726 A2 | 6/2010 |

OTHER PUBLICATIONS

Office Action dated Sep. 1, 2015, issued by the Korean Intellectual Property Office in corresponding Korean Application No. 10-2014-7028172.

Office Action dated Mar. 28, 2016 from Korean Intellectual Property Office in counterpart Korean Application No. 10-2014-7028172.

Office Action dated Apr. 19, 2016 in Taiwan Application No. 102108683.

\* cited by examiner

PHOTO-CURABLE COMPOSITION FOR IMPRINTS, PATTERN FORMING METHOD AND PATTERN

CROSS-REFERENCE TO RELATED APPLICATIONS

This application is a Continuation of PCT International Application No. PCT/JP2013/051563 filed on Jan. 25, 2013, which claims priority under 35 U.S.C §119(a) to Japanese Patent Application No. 2012-056158, filed on Mar. 13, 2012. The above application is hereby expressly incorporated by reference, in its entirety, into the present application.

TECHNICAL FIELD

The present invention relates to a photo-curable composition for imprints, and more specifically to a photo-curable composition for imprints used for imprinting process aimed to increase the degree of integration of circuit of semiconductor element or the like and recording density, and a fine pattern forming method (imprinting) using the photo-curable composition for imprints.

BACKGROUND ART

In pursuit of higher integration of circuit of semiconductor element or the like, or recording density, there is a need for finer processing technique. Photolithographic process based on light exposure, as this sort of fine processing technique, can deal with fine processing in a large area at a time, but the resolution cannot be shorter than the wavelength of light. For this reason, recent photolithographic technique employs shorter wavelength including 193 nm (ArF), 157 nm (F2), 13.5 nm (EUV). Shortened wavelength of light, however, restricts substances which allow the light to transmit therethrough, and this limits formation of the fine pattern.

On the other hand, according to methods such as electron beam lithography and focused ion beam lithography, fine pattern may be formed, where the resolution does not depend on the wavelength of light. The methods however suffer from poor throughput.

Patent Literature 1 and Patent Literature 2 describe methods of forming fine patterns using photo-curable composition for imprints which contain isobornyl acrylate (IBXA).

Patent Literature 3 and Patent Literature 4 describe methods of forming fine patterns using photo-curable composition for imprints which contain fluorine-containing compounds and gas generating agents.

Patent Literature 5 describes a method of improving the viscosity of a photo-curable composition for imprints.

CITATION LIST

Patent Literature

[Patent Literature 1] JP-T-2007-523249
[Patent Literature 2] JP-T-2010-530641
[Patent Literature 3] JP-A-2010-258026
[Patent Literature 4] JP-A-2010-262980
[Patent Literature 5] JP-A-2007-186570
[Patent Literature 6] JP-A-2010-186979

SUMMARY OF THE INVENTION

Technical Problem

In this situation, the present inventors found out from our investigations that the photo-curable composition for imprints described in Patent Literature 1 and Patent Literature 2 showed only poor levels of dry-etching durability. Patent Literature 3 and Patent Literature 4, addressing the problem of separation of resist film, were found to suffer from high viscosity and poor dry-etching durability. Patent Literature 5, addressing the problems of viscosity and durability, was found to solve the problem of dry-etching durability only to an insufficient degree, with an additional problem of fracture of pattern. Patent Literature 6, addressing the problem of dry-etching durability, was found to suffer from high viscosity and low ratio of mold filling.

In short, from investigations of the present inventors, the conventional photo-curable composition for imprints have suffered from the problems that the compositions are hardly filled into the mold pattern densely, that the dry-etching durability is poor, and that the pattern is sometimes broken due to stress when released from the mold.

The present invention is aimed at solving the conventional problems described above, and is to provide a photo-curable composition for imprints which can ensure high ratio of mold filling and low defect density during mold releasing, and can provide a resist material with high etching durability.

Solution to Problem

In this situation, the present inventors found out from our investigations that the photo-curable composition for imprints was successfully improved in the ratio of mold filling, reduced in the defect density during mold releasing, and improved in the dry-etching durability, by decreasing the viscosity of the photo-curable composition for imprints, by increasing the crosslink density of the photo-curable composition for imprints, and by controlling the Ohnishi parameter in a specific range, which led us to complete an invention. Specifically, the problems were solved by the configuration <1>, preferably by configurations <2> to <15> below.

<1> A photo-curable composition for imprints comprising a monofunctional monomer, a polyfunctional monomer and a photo-polymerization initiator, having a viscosity at 25° C. of 15 mPa·s or smaller, an Ohnishi parameter of 3.0 or smaller, and a crosslink density calculated by (Formula 1) of 0.6 mmol/cm$^3$ or larger.

[Chemical Formula 1]

Crosslink density={Σ(Ratio of mixing of polyfunctional monomer (parts by mass)*Number of functional groups of polyfunctional monomer/Molecular weight of polyfunctional monomer)}/Specific gravity. (Formula 1)

<2> The photo-curable composition for imprints of <1>, wherein the polyfunctional monomer is represented by the formula (2) below:

Formula (2)

[Chemical Formula 2]

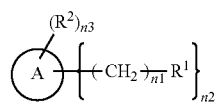

(in the formula (2), A represents a monocycle or condensed alicyclic hydrocarbon group, R$^1$ represents a polymerizable group, and R$^2$ represents a substituent. n1 represents an integer of 1 to 3, n2 represents an integer of 1 to 6, and n3 represents an integer of 0 to 5. When n2 is 1, at least one of (R$^2$)s represents a polymerizable group.)

<3> The photo-curable composition for imprints of <2>, wherein $R^1$ represents a (meth)acryloyloxy group.

<4> The photo-curable composition for imprints of <2> or <3>, wherein n2 represents an integer of 2 to 6.

<5> The photo-curable composition for imprints of any one of <2> to <4>, wherein "A" represents an alicyclic hydrocarbon group comprises a monocycle or a condensed ring having 2 or 3 rings.

<6> The photo-curable composition for imprints of any one of <2> to <5>, wherein "A" represents tricyclodecane.

<7> The photo-curable composition for imprints of any one of <1> to <6>, wherein the monofunctional monomer is (meth)acrylate.

<8> The photo-curable composition for imprints of any one of <1> to <7>, wherein the polyfunctional monomer is tricyclodecane dimethanol di(meth)acrylate and/or cyclohexanedimethanol di(meth)acrylate.

<9> The photo-curable composition for imprints of any one of <1> to <8>, wherein the monofunctional monomer is benzyl(meth)acrylate.

<10> The photo-curable composition for imprints of any one of <1> to <9>, further comprising a fluorine atom-containing compound having a fluorine content of 10 to 70%.

<11> The photo-curable composition for imprints of any one of <1> to <10>, wherein the fluorine-containing compound is a fluorine-containing polymer, fluorine-containing oligomer, fluorine-containing monomer, or fluorine-containing surfactant.

<12> A pattern forming method comprising:
applying the photo-curable composition described in any one of <1> to <11> onto a base, to thereby form a pattern-forming layer;
pressing a mold onto the pattern-forming layer; and
irradiating the pattern-forming layer with light, or,
applying the photo-curable composition described in any one of <1> to <11> onto a mold, to thereby form a pattern-forming layer;
pressing abase onto the surface of the pattern-forming layer; and
irradiating the pattern-forming layer with light.

<13> A pattern obtained by using the pattern forming method described in <12>.

<14> A method of manufacturing a semiconductor device, the method comprising the pattern forming method described in <12>.

<15> A semiconductor device obtained by using the method of manufacturing a semiconductor device described in <14>.

Advantageous Effects of Invention

According to the present invention, it now becomes possible to provide a photo-curable composition for imprints which can ensure high ratio of mold filling and low defect density during mold releasing, and can provide a resist material with high etching durability.

DESCRIPTION OF EMBODIMENTS

The present invention will be explained in detail below. As used herein, the numerical ranges expressed with "to" are used to mean the ranges including the values indicated before and after "to" as lower and upper limits.

In this specification, "(meth)acrylate" means acrylate and methacrylate, "(meth)acryl" means acryl and methacryl, and "(meth)acryloyl" means acryloyl and methacryloyl. Also in this specification, "monomer" is synonymous to "monomer". The monomer in the context of the present invention is discriminable from oligomer and polymer, and has a weight-average molecular weight of 2,000 or smaller.

"Imprinting" in the context of the present invention means transfer of pattern preferably having a size of 1 nm to 10 mm, and more preferably means transfer of pattern having a size of approximately 10 nm to 100 μm (nano-imprinting). In this specification, notation of group (atomic group) without being preceded by "substituted" or "unsubstituted", is used to encompass not only group having no substituent, but also group having substituent. For example, "alkyl group" encompass not only alkyl group having no substituent (unsubstituted alkyl group), but also alkyl group having substituent (substituted alkyl group).

The photo-curable composition for imprints of the present invention (also referred to as "the composition of the present invention", hereinafter) contains a monofunctional monomer, a polyfunctional monomer and a photo-polymerization initiator, having a viscosity at 25° C. of 15 mPa·s or smaller, an Ohnishi parameter of 3.0 or smaller, and a crosslink density calculated by (Formula 1) of 0.6 mmol/cm³ or larger.

[Chemical Formula 3]

Crosslink Density={Σ(Ratio of mixing of polyfunctional monomer(ratio of mass)*Number of functional groups of polyfunctional monomer/Molecular weight of polyfunctional monomer)}/Specific gravity (Formula 1)

"Ratio of mixing of polyfunctional monomer*Number of functional groups of polyfunctional monomer" means products of "Ratio of mixing of polyfunctional monomer" and "Number of functional groups of polyfunctional monomer".

The viscosity of the composition of the present invention at 25° C. is preferably 15 mPa·s or smaller, preferably 5 to 13 mPa·s, and more preferably 8 to 12 mPa·s. The smaller the viscosity of the composition, the larger the ratio of mold filling in general, wherein too small viscosity would tend to degrade ability of ink-discharging.

The Ohnishi parameter of the compound of the present invention is 3.0 or smaller. The Ohnishi parameter is defined by (Sum of number of C, H and O atoms/(Number of C atoms−Number of O atoms)). The Ohnishi parameter is preferably 2.9 or smaller, and more preferably 2.8 or smaller. The lower the Ohnishi parameter, the higher the etching durability in general.

The crosslink density of the composition of the present invention is 0.6 mmol/cm³ or larger, preferably 1.0 mmol/cm³ or larger, and furthermore preferably 1.3 mmol/cm³ or larger. The larger the crosslink density, the lesser the defects during mold releasing in general.

The ratio of mixing (ratio of mass) of the polyfunctional monomer in the composition of the present invention is preferably 1 to 50% by mass of the composition, more preferably 5 to 30% by mass, and more preferably 10 to 25% by mass.

The number of functional groups (number of polymerizable groups) of the polyfunctional monomer in the composition of the present invention is preferably 2 to 8 in integer, more preferably 2 to 6 in integer, furthermore preferably 2 to 4 in integer, furthermore preferably 2 or 3, and particularly 2.

The molecular weight of the polyfunctional monomer in the composition of the present invention is preferably 170 to 500, more preferably 200 to 400, and furthermore preferably 250 to 350.

The viscosity of the polyfunctional monomer in the composition of the present invention is preferably 1 to 100 mPa·s, more preferably 1 to 80 mPa·s, and furthermore preferably 1 to 60 mPa·s.

The polyfunctional monomer used in the present invention are not specifically limited so long as it satisfies the above-described conditions, and is exemplified by (meth)acrylate, epoxy compound, oxethane compound, vinyl ether compound, styrene derivative, propenyl ether or butenyl ether.

(Meth)acrylate is preferably used in the present invention, and is exemplified by diethylene glycol monoethyl ether (meth)acrylate, dimethylol dicylopentane di(meth)acrylate, di(meth)acrylated isocyanurate, 1,3-butyrene glycol di(meth)acrylate, 1,4-butanediol di(meth)acrylate, EO-modified 1,6-hexanediol di(meth)acrylate, ECH-modified 1,6-hexanediol di(meth)acrylate, aryloxypolyethylene glycol acrylate, 1,9-nonediol di(meth)acrylate, EO-modified bisphenol A di(meth)acrylate, PO-modified bisphenol A di(meth)acrylate, modified bisphenol A di(meth)acrylate, EO-modified bisphenol F di(meth)acrylate, ECH-modified hexahydrophthalic acid diacrylate, hydroxypivalic acid neopentyl glycol di(meth)acrylate, neopentyl glycol di(meth)acrylate, EO-modified neopentyl glycol diacrylate, propylene oxide (referred to as "PO", hereinafter)-modified neopentyl glycol diacrylate, caprolactone-modified hydroxypivalate ester neopentyl glycol, stearic acid-modified pentaetythritol di(meth)acrylate, ECH-modified phthalic acid di(meth)acrylate, poly(ethylene glycol-tetramethylene glycol)di(meth)acrylate, poly(propylene glycol-tetramethylene glycol)di(meth)acrylate, polyester (di)acrylate, polyethylene glycol di(meth)acrylate, polypropylene glycol di(meth)acrylate, ECH-modified propylene glycol di(meth)acrylate, silicone di(meth)acrylate, triethyleneglycol di(meth)acrylate, tetraethylene glycol di(meth)acrylate, dimethylol tricyclodecane di(meth)acrylate, neopentyl glycol-modified trimethylol propane di(meth)acrylate, tripropylene glycol di(meth)acrylate, EO-modified tripropylene glycol di(meth)acrylate, triglycerol di(meth)acrylate, dipropylene glycol di(meth)acrylate, divinylethylene urea, divinyl propylene urea, o-, m-, p-xylylene di(meth)acrylate, 1,3-adamantane diacrylate, norbornane dimethanol di(meth)acrylate, and tricyclodecane dimethanol di(meth)acrylate.

In the present invention, it is particularly preferable that the polyfunctional monomer is represented by the formula (2) below:

Formula (2)

[Chemical Formula 4]

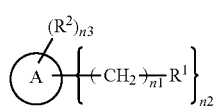

(In the formula (2), A represents a monocycle or condensed alicyclic hydrocarbon group, $R^1$ represents a polymerizable group, and $R^2$ represents a substituent. n1 represents an integer of 1 to 3, n2 represents an integer of 1 to 6, and n3 represents an integer of 0 to 5. When n2 is 1, at least one of ($R^2$)s is a polymerizable group.)

By using such compound having a methylene chain adjacent to the cyclic structure, the cyclic structure demonstrates the etching durability, the methylene chain adjacent to the cyclic structure makes the polyfunctional monomer more movable in the composition, to thereby reduce the viscosity, and improve the mold filling.

"A" represents a monocycle or condensed alicyclic hydrocarbon group, and is preferably an alicyclic hydrocarbon group which is composed of ring(s) having 3 to 30 carbon atoms, and more preferably an alicyclic hydrocarbon group which is composed of ring(s) having 5 to 20 carbon atoms.

"A" is preferably configured by a monocycle, or a condensed ring having 2 or 3 rings. "A" is preferably a 5-membered or 6-membered ring, or, a condensed ring of 5-membered or 6-membered ring, more preferably cyclohexane, norbornane or tricyclodecane, and furthermore preferably tricyclodecane.

$R^1$ is preferably a (meth)acryloyloxy group, and more preferably an acryloyloxy group.

$R^2$ represents a substituent, and is preferably a polymerizable group or alkyl group, more preferably (meth)acryloyloxy group or methyl group, and particularly acryloyloxy group.

n1 represents an integer of 1 to 3, and more preferably 1 or 2.

n2 represents an integer of 1 to 6, more preferably an integer of 2 to 6, furthermore preferably an integer of 2 to 4, more preferably 2 or 3, and particularly 2. When n2 is 3 or larger, the viscosity of the polyfunctional monomer considerably increases, making it difficult to control the viscosity of the composition within a preferable range.

n3 represents an integer of 0 to 5, preferably an integer of 0 to 3, and furthermore preferably 0.

Examples of the polyfunctional monomer preferably used in the present invention are shown below, of course without limiting the present invention.

[Chemical Formula 5]

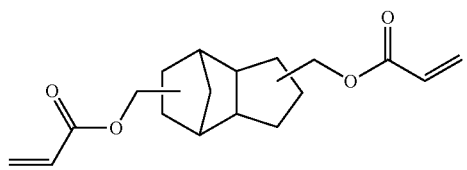

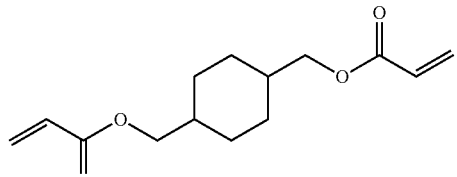

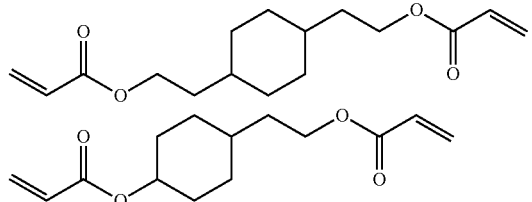

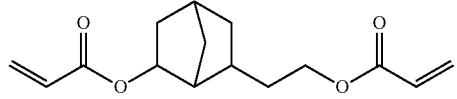

In the present invention, the polyfunctional monomer is particularly tricyclodecane dimethanol di(meth)acrylate and/or cyclohexanedimethanol di(meth)acrylate.

The composition of the present invention contains a monofunctional monomer. The monofunctional monomer in the present invention is not specifically limited in terms of species.

The ratio of mixing (ratio of mass) of the monofunctional monomer in the composition of the present invention is preferably 45 to 99% by mass of the composition, more preferably 65 to 95% by mass, and furthermore preferably 70 to 90% by mass.

The molecular weight of the monofunctional monomer in the composition of the present invention is preferably 120 to 300, more preferably 150 to 250, and furthermore preferably 160 to 200.

The viscosity of the monofunctional monomer in the composition of the present invention is preferably 1 to 15 mPa·s, more preferably 1 to 12 mPa·s, and furthermore preferably 1 to 10 mPa·s.

The monofunctional monomer used in the present invention is exemplified by (meth)acrylate, epoxy compound, oxetane compound, vinyl ether compound, styrene derivative, propenyl ether and butenyl ether. (Meth)acrylate is preferable.

The monofunctional monomer used in the present invention preferably has an aromatic group and/or alicyclic hydrocarbon group, more preferably has an aromatic group, and particularly has a benzene ring.

Examples of these compound include benzyl(meth)acrylate, phenetyl(meth)acrylate, phenoxyethyl(meth)acrylate, 1- or 2-naphthyl(meth)acrylate, 1- or 2-naphthylmethyl(meth)acrylate, 1- or 2-naphthylethyl(meth)acrylate, 1- or 2-naphthoxyethyl(meth)acrylate, and any of these compounds having one or more substituent(s). Benzyl(meth)acrylate, phenetyl(meth)acrylate, and phenoxyethyl(meth)acrylate are more preferable, and benzyl(meth)acrylate is furthermore preferable.

Compound Having at Least One of Fluorine Atom and Silicon Atom

The composition of the present invention preferably contains a compound having at least one of fluorine atom and silicon atom, and more preferably contains a compound having at least fluorine atom. Such compound may be either of polymer and monomer, and may be so-called surfactant, where monomer is preferable. By adding this sort of material, the mold releasability may further be improved.

The fluorine atom-containing compound preferably has a ratio of fluorine content, given by the equation below, of 10 to 70%, and more preferably 40 to 60%.

$$\text{Fluorine content} = \frac{\text{Number of fluorine atoms in compound} \times \text{Atomic weight of fluorine atom}}{\text{Molecular weight of compound}} \times 100$$

[Chemical Formula 6]

A preferable embodiment of the fluorine atom-containing compound is exemplified by a compound having a perfluoroalkyl group, and is more preferably by a compound having a moiety represented by the formula (I) below:

[Chemical Formula 7]

—CH$_2$CH$_2$—C$_n$F$_{2n+1}$      Formula (I)

In the formula (I), n represents an integer of 1 to 8, and preferably an integer of 4 to 6.

A first embodiment of the fluorine atom-containing compound used in the present invention is exemplified by any of molecules having a hydrophobic terminal. The surfactant is a fluorine atom-containing compound. Examples of the surfactant may be referred to the description of paragraph [0077] in JP-A-2011-159881. Another exemplary surfactant is commercially available under the trade name of ZONYL (registered trademark) FSO-100 from DuPont (registered trademark), which is represented by a general structure of R$^1$R$^2$, where R$^1$ represents F(CF$_2$CF$_2$)$_y$, y is an integer of 1 to 7, R$^2$ represents CH$_2$CH$_2$O(CH$_2$CH$_2$O)$_x$H, and x is an integer of 0 to 15.

A second embodiment of the fluorine atom-containing compound is exemplified by fluorine atom-containing polymerizable compound. The polymerizable compound is more preferably (meth)acrylate, and more preferably (meth)acrylate having a moiety represented by the formula (I) above. By using the compound having such moiety, the composition will keep good pattern formability even after repetitive transfer of pattern, and will be improved in temporal stability.

Other examples of the compound having at least either one of fluorine atom and silicon atom, preferably used in the present invention, may be referred to the description of paragraphs [0059] to [0084] in JP-A-2012-031389.

In the present invention, the first embodiment is more preferable.

The ratio of mixing of the compound containing at least either one of fluorine atom and silicon atom, in the composition of the present invention, is preferably 0 to 10% by mass of the composition, and more preferably 0.1 to 5% by mass.

In one preferable embodiment of the present invention, the (meth)acrylate having an alicyclic hydrocarbon group and/or aromatic group, used as the polyfunctional and the monofunctional monomers, preferably accounts for 70 to 100% by mass of the total polymerizable components, more preferably 90 to 100% by mass, and particularly 95 to 100% by mass.

In a particularly preferable embodiment, the polymerizable compound (1) below accounts for 45 to 99% by mass of the total polymerizable components (more preferably 65 to 95% by mass), the polymerizable compound (2) below accounts for 5 to 30% by mass of the total polymerizable components, (more preferably, 10 to 25% by mass), and the compound (3) accounts for 0 to 10% by mass of the composition (more preferably, 0.1 to 5% by mass).

(1) polymerizable compound having an alicyclic hydrocarbon group and/or aromatic group, and one (meth)acrylate;

(2) polymerizable compound having alicyclic hydrocarbon group and/or aromatic group, and two (meth)acrylate groups; and (3) compound containing at least one of fluorine atom and silicon atom.

In the composition of the present invention, the amount of mixing of any component, other than the polymerizable monomer component, the component containing at least one of fluorine atom and silicon atom, and polymerization initiator, is preferably 5% by mass or less of the total composition.

Photo-Polymerization Initiator

The curable composition of the present invention contains a photo-polymerization initiator. The photo-polymerization initiator used in the present invention is arbitrarily selectable from compounds capable of generating an active species which polymerizes the polymerizable compound upon irradiation of light. The photo-polymerization initiator is preferably a radical polymerization initiator or cationic polymerization initiator, wherein the radical polymerization initiator is more preferable. In the present invention, a plurality of photo-polymerization initiators may be used in combination.

The content of the photo-polymerization initiator to be in all of the component except for solvents in the composition of the invention may be, for example, from 0.01 to 15% by mass of all the polymerizable monomers constituting the composition, preferably from 0.1 to 12% by mass, more preferably from 0.2 to 7% by mass. In case where two or more different types of photo-polymerization initiators are used, the total amount thereof falls within the above range. When the content of the photo-polymerization initiator is at least 0.01% by mass, then it is favorable since the sensitivity (rapid curability), the power of resolution, the line edge accuracy and the coating film strength of the composition tend to be better. On the other hand, when the content of the photopolymerization initiator is at most 15% by mass, it is also favorable since the light transmittance, the discoloration resistance and the handlability of the composition tend to be better.

The radical photo-polymerization initiator used in the present invention is selectable typically from those commercially available. Those described for example in paragraph [0091] of JP-A-2008-105414 may preferably be used. Among them, acetophenone-based compound, acylphosphine oxide-based compound, and oxim ester-based compound are preferable from the viewpoints of curing sensitivity and absorption characteristics.

The acetophenone-base compound may preferably be exemplified by hydroxyacetophenone-base compound, dial koxyacetophenone-base compound, and aminoacetophenone-base compound. The hydroxyacetophenone-base compound may preferably be exemplified by Irgacure (registered trademark) 2959 (1-[4-(2-hydroxyethoxy)phenyl]-2-hydroxy-2-methyl-1-propane-1-one, Irgacure (registered trademark) 184 (1-hydroxycyclohexylphenylketone) Irgacure (registered trademark) 500 (1-hydroxycyclohexylphenylketone, benzophenone), Darocur (registered trademark) 1173 (2-hydroxy-2-methyl-1-phenyl-1-propane-1-one), all of which are available from.

The dialkoxyacetophenone-base compound may preferably be exemplified by Irgacure (registered trademark) 651 (2,2-dimethoxy-1,2-diphenylethane-1-one) available from BASF GmbH.

The aminoacetophenone-base compound may preferably be exemplified by Irgacure (registered trademark) 369 (2-benzyl-2-dimethylamino-1-(4-morpholinophenyl) butanone-1), Irgacure (registered trademark) 379 (EG) (2-dimethylamino-2-(4-methylbenzyl)-1-(4-morpholine-4-yl-phenyl) butane-1-one), and Irgacure (registered trademark) 907 (2-methyl-1-[4-methylthiophenyl]-2-morpholinopropane-1-one), all of which are available from BASF GmbH.

The acylphosphine oxide-base compound may preferably be exemplified by Irgacure (registered trademark) 819 (bis(2,4,6-trimethylbenzoyl)-phenylphosphine oxide), Irgacure (registered trademark) 1800 (bis(2,6-dimethoxybenzoyl)-2,4,4-trimethyl-pentylphosphine oxide), Lucirin TPO (2,4,6-trimethylbenzoyldiphenylphosphine oxide), and Lucirin-TPO-L (2,4,6-trimethylbenzoylphenylethoxyphosphine oxide), all of which are available from BASF GmbH. The oxime ester-base compound may preferably be exemplified by Irgacure (registered trademark) OXE01 (1,2-octanedione, 1-[4-(phenylthio)phenyl]-2-(O-benzoyloxime)), and Irgacure (registered trademark) OXE02 (ethanone, 1-[9-ethyl-6-(2-methylbenzoyl)-9H-carbazole-3-yl]-1-(O-acetyloxime)), all of which are available from BASF GmbH.

The cation photo-polymerization initiator adoptable to the present invention is preferably sulfonium salt compound, iodonium salt compound, and oxime sulfonate compound, and may preferably be exemplified by 4-methylphenyl[4-(1-methylethyl)phenyliodonium tetrakis(pentafluorophenyl) borate (PI2074, from Rhodia) 4-methylphenyl[4-(2-methylpropyl)phenyliodonium hexafluorophophate (Irgacure 250), Irgacure PAG103, 108, 121 and 203 (from Ciba).

In the invention, "light" includes not only those having with a wavelength falling within a range of ultraviolet, near-ultraviolet, far-ultraviolet, visible, infrared, and electromagnetic waves but also radiations. The radiations include, for example, microwaves, electron beams, EUV, X-rays. In addition, laser rays such as 248 nm excimer laser, 193 nm excimer laser, 172 nm excimer laser are also usable herein. These lights may be monochromatic lights (single wavelength lights) having passed through optical filters, or may be lights of different wavelengths (composite lights).

(Other Components)

Besides the above-described polymerizable compound and photo-polymerization initiator, the curable composition of the present invention may contain anti-oxidant, solvent, polymer component, pigment, dye and other components, without degrading the effects of the present invention.

—Antioxidant—

Additionally, the curable composition the present invention preferably contains any of known anti-oxidants. The content of the antioxidant to be in the composition is, for example, from 0.01 to 10% by mass of the total amount of the polymerizable monomers constituting the composition, preferably from 0.2 to 5% by mass. When two or more different types of antioxidants are in the composition, the total amount thereof falls within the above range. Preferable examples of the anti-oxidant may be referred to the description of paragraphs [0037] to [0039] in JP-A-2012-041521, the contents of which are incorporated by reference into this specification.

—Polymerization Inhibitor—

The curable composition of the present invention also preferably contains a polymerization inhibitor. By containing the polymerization inhibitor, it tends to be suppressed viscosity change with time, occurrence of foreign matters and the degradation of pattern formability. The content of the polymerization inhibitor is from 0.001 to 1% by mass, more preferably from 0.005 to 0.5% by mass, and even more preferably from 0.008 to 0.05% by mass, relative to all the polymerizable monomers. Preferable examples of the polymerization inhibitor may be referred to the description of paragraph [0102] in JP-A-2011-231308, the content of which is incorporated by reference into this specification.

—Polymer Component—

The composition of the present invention may contain a polymer component, for the purpose of further improving the crosslink density. Examples of the polymer component may be referred to the description of paragraph [0117] in JP-A-2011-231308, the content of which is incorporated by reference into this specification.

Considering the fact that the pattern formability improves when the content of the compound having a molecular weight of 2000 or larger is 30% by mass or less of the components, excluding the solvent, of the composition of the present invention, the content of such component is preferably small. Besides the surfactant and a trace amount of additive, the polymer component is preferably not contained.

The composition of the present invention may contain a solvent, where the content of the solvent is preferably 1% by mass or less of the total composition. It is particularly preferable that the composition is substantially solvent-free.

Besides the components described above, the curable composition of the present invention may optionally be added with mold releasing agent, silane coupling agent, UV acid amplifier, photobase generator, basic compound, fluidity modifier, defoaming agent, dispersant and so forth.

The photo-curable composition for imprints of the present invention may be prepared by mixing the individual components described above. The mixing and dissolution of the curable composition are conducted in the temperature range from 10 to 40° C. in general. In the present invention, mixing of the individual components of the curable composition is preferably followed by stirring. By the stirring, the non-polymerizable compound may be dissolved with ease into the composition. Since the non-polymerizable component used in the present invention is exothermic, it of course naturally dissolves simply by allowing it to stand still.

After mixing the individual components, the mixture is preferably filtered through a filter with a pore size of 0.003 μm to 5.0 μm, and more preferably 0.01 to 1.0 μm. The filtration may be implemented according to a multi-stage process, or may be repeated a plurality of times. The filtrate may be re-filtered. Material for composing a filter used for filtration may be polyethylene resin, polypropylene resin, fluorine-containing resin, nylon resin or the like, but not specifically limited.

[Pattern Forming Method]

Next, a method of forming a pattern (in particular, fine irregularity pattern) using the photo-curable composition for imprints of the present invention will be explained. In the pattern forming method of the present invention, the fine irregularity pattern may be formed by placing the photo-curable composition of the present invention onto a substrate or support (base), to thereby form a pattern-forming layer; pressing a mold onto the surface of the pattern-forming layer; and irradiating the pattern-forming layer with light, to thereby cure the composition of the present invention.

It is now preferable to further heat and cure the photo-curable composition for imprints of the present invention after the light exposure. More specifically, the pattern-forming layer composed of at least the composition of the present invention is placed on the base (substrate or support), optionally dried to form a layer (pattern-forming layer) composed of the composition of the present invention to thereby create a pattern acceptor (which corresponds to the base with the pattern-forming layer provided thereon), the mold is pressed onto the surface of the pattern-forming layer of the pattern acceptor, so as to transfer the mold pattern, and then the pattern-forming layer having the fine irregularity transferred thereon is cured by photo-irradiation. Photo-imprinting lithography, based on the pattern forming method of the present invention is also applicable to stacking or multiple patterning, and is also usable in combination with general heat imprinting.

The photo-curable composition for imprints of the present invention is capable of forming, based on the photo-nanoimprinting, a fine pattern with low cost and high accuracy. Accordingly, the fine pattern having been formed by the conventional photolithographic technique will now be formed with still lower cost and still higher accuracy. For example, the composition of the present invention may be coated on a substrate or support, and a layer composed of the composition may be exposed to light, cured, and optionally dried (baked), to be used as a permanent film such as overcoat layer or insulating layer used typically in liquid crystal display (LCD), or an etching resist typically used for manufacturing semiconductor integrated circuit, recording material or flat panel display. In particular, the pattern formed using the photo-curable composition for imprints of the present invention shows excellent etching durability, and is advantageously used as an etching resist in dry etching using fluorocarbon or the like.

As for the resist used as a permanent film (resist for forming structural members) used for liquid crystal display (LCD) or the like, or the resist used for substrate processing, it is preferable to avoid as possible contamination of metal or ionic impurity of organic substance, so as not to interfere operations of the product. For this reason, concentration of metal or ionic impurity of organic substance in the photo-curable composition for imprints of the present invention is 1 ppm or less, preferably 100 ppb or less, and furthermore preferably 10 ppb or below.

Next paragraphs will specifically describe a pattern forming method (pattern transfer method) using the photo-curable composition for imprints of the present invention.

In the pattern forming method of the present invention, first, the composition of the present invention is applied onto the base to form a pattern-forming layer.

Method of applying the photo-curable composition for imprints of the present invention onto the base is selectable from those well known to the public.

In the present invention, a coated film or liquid droplet may be applied onto the base, for example, by dip coating, air knife coating, curtain coating, wire bar coating, gravure coating, extrusion coating, spin coating, slit scan coating or ink jet process. The composition of the present invention is particularly suitable for ink jet process. Thickness of the pattern forming layer composed of the composition used in the present invention is approximately 0.03 μm to 30 μm, which may vary depending on applications. The composition may be coated according to a multiple-coating scheme. In a method of forming liquid droplets onto the underlay film typically by ink jet process, liquid droplets preferably has a volume of approximately 1 pl to 20 pl, and are arranged on the underlay film while being spaced from each other. Between the base and the pattern-forming layer composed of the composition of the present invention, any other organic layer such as planarizing layer may be formed. In this case, since the pattern-forming layer is prevented from being brought into contact directly with the base, so that the base may be prevented from catching dust thereon, or from being damaged. The pattern formed by using the composition of the present invention is excellent in the adherence with the organic layer, even if the organic layer is provided on the base.

The base (substrate or support) on which photo-curable composition for imprints of the present invention is coated, is selectable depending on various purposes but without special limitation, from quartz, glass, optical film, ceramic material, evaporated film, magnetic film, reflective film, substrate of metal such as Ni, Cu, Cr or Fe, paper, SOG (Spin On Glass), polymer substrate such as polyester film, polycarbonate film or polyimide film, TFT array substrate, electrode plate of PDP, glass or translucent plastic substrate, electro-conductive base composed of ITO or metal, insulating base, substrate for semiconductor process composed of silicon, silicon nitride, polysilicon, silicon oxide, and amorphous silicon. Also geometry of the base is not specifically limited, and may be in the form of plate or rolled sheet. In addition, as described later, the base is selectable from light-transmissive ones or non-light-transmissive ones, depending on combination with the mold.

Next, in the patterning method of the invention, a mold is pressed against the surface of the patterning layer for transferring the pattern from the mold onto the patterning layer. Accordingly, the micropattern previously formed on the pressing surface of the mold is transferred onto the patterning layer.

Alternatively, the composition of the invention may be coated over the mold having a pattern formed thereon, and the base may be pressed thereto. In the present invention, it is also preferable to heat the substrate when the mold is pressed. The heating temperature is 25 to 30° C. or around. By the heating, the viscosity of the curable composition may be reduced, and thereby the effect of the present invention will be more likely to be demonstrated in an effective manner.

Next, the mold material adoptable to the present invention will be. explained. For photonanoimprint lithography using the composition of the invention, a light-transmissive material is selected for composing at least either one of the mold and substrate. In the photoimprinting lithography adopted to the present invention, the curable composition for imprints is coated over the substrate to form the pattern forming layer, the light-transmissive mold is pressed to the surface thereof, and light is irradiated from the back side of the mold to thereby cure the pattern forming layer. Alternatively, the curable composition may be coated over the light-transmissive substrate, the mold may be pressed thereto, and light may be irradiated from the back side of the substrate to thereby cure the curable composition. The photoirradiation may be conducted while keeping the mold in contact or after releasing the mold. The photoirradiation with the mold kept in contact is preferred in the present invention.

The mold usable in the present invention has a pattern to be transferred. The pattern on the mold may be formed with a desired level of processing accuracy, typically by photolithography, electron beam lithography and so forth. Methods of forming the pattern on the mold is not specifically limited in the present invention.

With the curable composition of the present invention, a good pattern formability may be obtained when a mold having a minimum pattern size of 50 nm or smaller is used for pattern transfer.

Not specifically defined, the light-transmissive mold material for use in the invention may be any one having a desired strength and durability. Concretely, its examples include glass, quartz, light-transparent resin such as PMMA or polycarbonate resin, transparent metal deposition film, flexible film of polydimethylsiloxane or the like, photocured film, metal film, etc.

The non-light-transmissive mold to be used in the invention where a light-transmissive substrate is used is not also specifically defined and may be any one having a predetermined strength. Concretely, examples of the mold material include ceramic material, deposition film, magnetic film, reflective film, metal material of Ni, Cu, Cr, Fe or the like, as well as SiC, silicon, silicon nitride, polysilicon, silicon oxide, amorphous silicon, etc. However, these are not limitative. The shape of the mold is not also specifically defined, and may be any of a tabular mold or a roll mold. The roll mold is used especially when continuous transfer in patterning is desired.

The mold used in the pattern forming method of the present invention may be preliminarily subjected to anti-sticking treatment, for the purpose of improving separability between the curable composition and the mold. The mold of the type includes those surface-treated with a silicone-type or fluorine-containing silane coupling agent, for which, for example, commercial release agents such as Daikin's Optool DSX, Sumitomo 3M's Novec EGC-1720 and others are preferred. The curable composition of the present invention, however, shows a good pattern formability, even when a mold without preliminary anti-sticking treatment is used.

When the composition used in the present invention is used in photoimprinting lithography, the pattern formation method. of the present invention is preferably conducted under a mold pressure of 10 atm or below. By adjusting the mold pressure to 10 atm or below, there are tendencies of suppressing deformation of the mold and substrate, and improving the pattern accuracy. The low pressure is preferable also in terms of possibility of downsizing the apparatus. The mold pressure is selectable within the range capable of ensuring uniformity in the mold transfer, when observed in a region of the curable composition for imprints thinned under projected portions of the mold.

In the pattern formation method of the present invention, energy of photoirradiation in the process of irradiating light to the pattern forming layer is good enough if it is sufficiently larger than a level energy required for curing. The level of energy of irradiation required for curing is appropriately determined, by analyzing consumption of the unsaturated bonds of the curable composition for imprints and tackiness of the cured film. In the photoimprinting lithography adoptable to the present invention, while the photoirradiation is generally conducted while keeping the substrate to normal temperature, the photoirradiation may also be conducted under heating in order to enhance the reactivity. Pre-conditioning of the photo-irradiation is preferably conducted in vacuum, or in a helium-purged atmosphere, wherein the helium-purged atmosphere is more preferable. By using the technique, vaporization of any low molecular components during the exposure is avoidable, and any changes in performance due to prolonged residence in the apparatus may be suppressed. In the pattern formation method of the present invention, a preferable degree of vacuum in the photoirradiation is in the range from $10^{-1}$ Pa to normal pressure.

Light to be used for photoirradiation to cure the curable composition of the invention is not specifically defined. For example, it includes light and irradiations with a wavelength falling within a range of high-energy ionizing radiation, near-ultraviolet, far-ultraviolet, visible, infrared, etc. The high-energy ionizing radiation source includes, for example, accelerators such as Cockcroft accelerator, Handegraf accelerator, linear accelerator, betatoron, cyclotron, etc. The electron beams accelerated by such an accelerator are used most conveniently and most economically; but also are any other radioisotopes and other radiations from nuclear reactors, such as $\gamma$ rays, X rays, $\alpha$ rays, neutron beams, proton beams, etc. The UV sources include, for example, UV fluorescent lamp, low-pressure mercury lamp, high-pressure mercury lamp, ultra-high-pressure mercury lamp, xenon lamp, carbon arc lamp, solar lamp, etc. The radiations include microwaves, EUV, etc. In addition, laser rays for use in microprocessing of semiconductors, such as LED, semiconductor laser ray, 248 nm KrF excimer laser ray, 193 nm ArF excimer laser ray and others, are also favorably used in the invention. These lights may be monochromatic lights, or may also be lights of different wavelengths (mixed lights).

In photoexposure, the light intensity is preferably within a range of from 1 mW/cm$^2$ to 50 mW/cm$^2$. When the light intensity is at least 1 mW/cm$^2$, then the producibility may increase since the photoexposure time may be reduced; and when the light intensity is at most 50 mW/cm$^2$, then it is favorable since the properties of the permanent film formed may be prevented from being degraded owing to side reaction. Also preferably, the dose in photoexposure is within a range of from 5 mJ/cm$^2$ to 1000 mJ/cm$^2$. When the dose is less than 5 mJ/cm$^2$, then the photoexposure margin may be narrow and there may occur problems in that the photocuring may be insufficient and the unreacted matter may adhere to mold. On the other hand, when the dose is more than 1000 mJ/cm², then the composition may decompose and the permanent film formed may be degraded.

During the exposure, it is also preferable to control oxygen concentration below 100 mg/L by evacuation, or by feeding an inert gas such as nitrogen, helium, argon or the like, in order to avoid oxygen poisoning in radical polymerization.

The pattern forming method of the present invention may optionally have a step, subsequently to the photo-curing of the pattern-forming layer, of further curing the cured pattern by heating. Heat curing of the composition of the present invention after the photo-irradiation is preferably conducted at 150 to 280° C., and more preferably 200 to 250° C. The heating time is preferably 5 to 60 minutes, and more preferably 15 to 45 minutes.

[Pattern]

The pattern formed by the above-described pattern forming method of the present invention is suitable as a permanent film (resist material for structural components) used for liquid crystal display (LCD) or the like, and as an etching resist. The permanent film after manufactured is bottled in a container such as gallon bottle, coated bottle or the like, to be transported and stored. The container may preliminarily be purged with inert nitrogen, argon or the like, for the purpose of preventing deterioration. While the permanent film may be transported and stored at normal temperature, temperature control in the range from −20° C. to 0° C. is also preferable for further preventive measures against deterioration. It is, of course, preferable to provide light shielding enough to prevent onset of the reaction.

The pattern formed by the pattern forming method of the present invention is also useful as an etching resist. When the composition for imprinting of the present invention is used as the etching resist, on a base, which is for example a silicon wafer having formed thereon a thin film of SiO₂ or the like, a nanometer-sized fine pattern is formed according to the pattern forming method of the present invention. The base is then etched using a hydrogen fluoride when conducted by wet etching, and using an etching gas such as CF₄ when conducted by dry etching, thereby a desired pattern may be formed on the base. The curable composition of the present invention is particularly excellent in the etching durability in dry etching.

EXAMPLE

The characteristics of the invention are described more concretely with reference to Production Examples and Examples given below. In the following Examples, the material used, its amount and the ratio, the details of the treatment and the treatment process may be suitably modified or changed not overstepping the scope of the invention. Accordingly, the invention should not be limitatively interpreted by the Examples mentioned below.

(Preparation of Curable Composition)

(Preparation of Photo-Curable Composition for Imprints)

The polymerizable monomers, photo-polymerization initiator and additives listed in Tables below were mixed, and the mixture was further added with 4-hydroxy-2,2,6,6-tetramethylpiperidine 1-oxyl free radical (from Tokyo Chemical Industry Co., Ltd.) as a polymerization inhibitor so as to adjust the content thereof to 200 ppm (0.02% by mass) of the polymerizable monomers. The mixture was then filtered through a 0.1-μm tetrafluoroethylene filter, to thereby prepare each photo-curable composition for imprints. Values in Tables are given in ratio by weight.

Benzylacrylate: Fancryl FA-BZA, from Hitachi Chemical Co., Ltd.

[Chemical Formula 8]

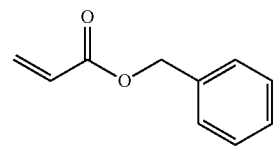

Phenetyl acrylate: from Polysciences, Inc.

[Chemical Formula 9]

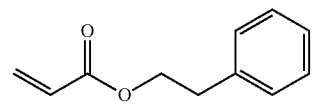

Tricyclodecane Dimethanol Diacrylate: NK Ester A-DCP, from Shin-Nakamura Chemical Co., Ltd.

[Chemical Formula 10]

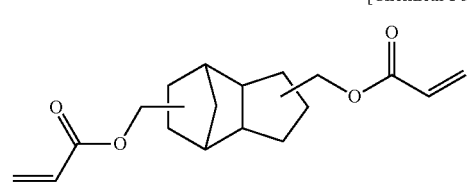

Cyclohexanedimethanol Diacrylate: CHDMDA, from NOF Corporation

[Chemical Formula 11]

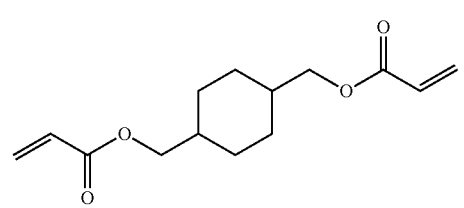

Compound 1: Synthesized from 4-(2-hydroxyethyl)cyclohexanol by the acid chloride method (acrylic acid chloride and triethylamine)

[Chemical Formula 12]

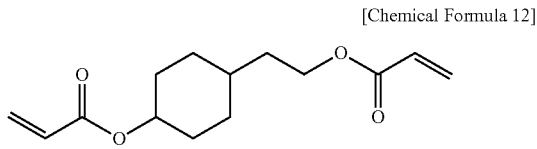 [SMILES: C=CC(=O)OCCC1CCC(OC(=O)C=C)CC1]

Compound 2: Synthesized from 6-(2-hydroxyethyl)-2-norbornal by the acid chloride method (using acrylic acid and triethylamine)

[Chemical Formula 13]

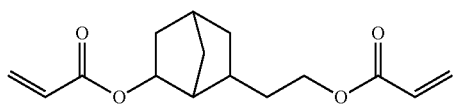

Acryloxymethyl Pentamethyldisiloxane

[Chemical Formula 14]

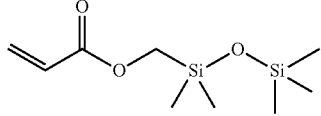

Isobornyl Acrylate: IBXA, from Osaka Organic Chemical Industry, Ltd.

[Chemical Formula 15]

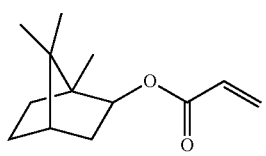

Ethylene Glycol Diacrylate: from Sigma-Aldrich

[Chemical Formula 16]

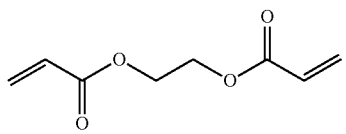

Nonanediol Diacrylate: Fancryl FA-129AS, from Hitachi Chemical Co., Ltd.

[Chemical Formula 17]

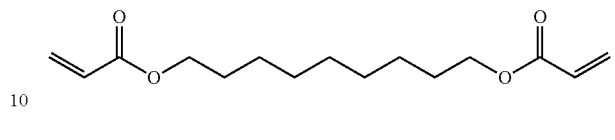

Neopentyl Glycol Diacrylate: KAYARAD NPGDA, from Nippon Kayaku Co., Ltd.

[Chemical Formula 18]

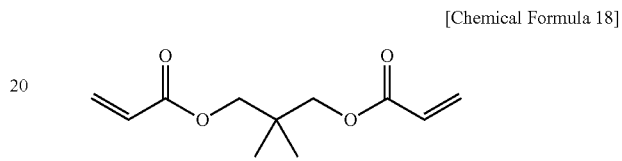

Trimethylol Tripropane Triacrylate: KAYARAD TMPTA, from Nippon Kayaku Co., Ltd.

[Chemical Formula 19]

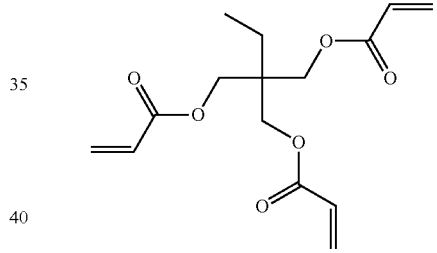

Aliphatic Monofunctional Urethane Acrylate: GENOMER 1122, from Rahn AG

Photomer 8127: from Cognis GmbH

[Chemical Formula 20]

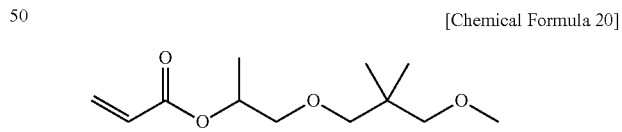

Compound A-1-1, Below:

[Chemical Formula 21]

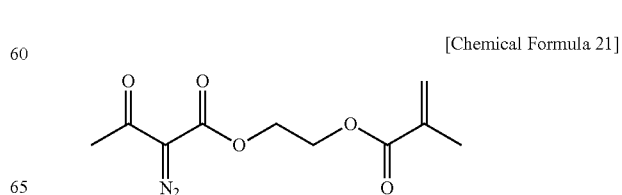

(Perfluorooctyl)Ethyl Acrylate: R-1820, from Daikin Industries, Ltd.

[Chemical Formula 22]

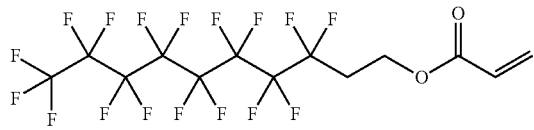

ZONYL (Registered Trademark) FSO-100: From DuPont

[Chemical Formula 23]

$F_3C-(CF_2)_n-CH_2CH_2OH$ n=7 or 8

Megafac F-780-F: from DIC Corporation

[Chemical Formula 24]

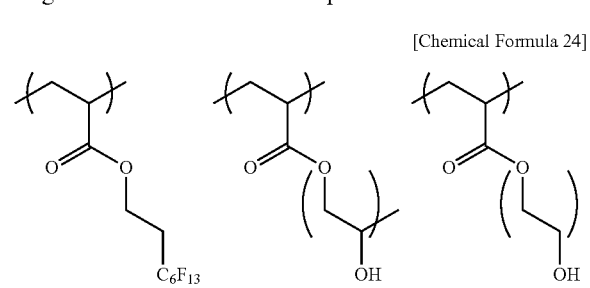

Darocur 1173: from BASF

[Chemical Formula 25]

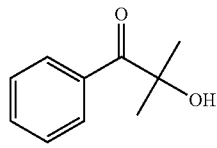

Lucirin TPO-L: from BASF

[Chemical Formula 26]

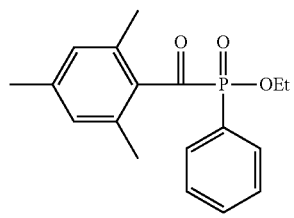

<Viscosity>

The viscosity at 25° C. was measured using an automatic viscometer VMC-252 (from Rigo Co., Ltd.), in mPa·s.

<Creation of Pattern>

Using an inkjet printer DMP-2831 from FUJIFILM Dimatix, Inc., the photo-curable composition for imprints was discharged with a volume of droplet per nozzle of 1 pl, so as to give a thickness of the obtainable residual patterned film of 15 nm thick, and a square matrix on a pitch of approximately 100 μm was formed by controlling the timing of discharging. In this process, the temperature of the curable composition to be discharged was adjusted to 25° C. A mold was placed thereon under a nitrogen gas flow, so as to be filled with the curable composition, exposed to light at a dose of 300 mJ/cm² irradiated from the mold side using a mercury lamp, and after the exposure, the mold was released to obtain a pattern. The mold pattern has a cross-shaped recess formed by lines of 10 μm wide and 50 μm long, which is arranged outside each of four corners of a 10-mm square region.

<Ratio of Pattern Filling>

The pattern was checked in a SEM image, and the cross-sectional area of the pattern was divided by the cross-sectional area of the mold pattern.

<Percentage of Residual Film after Dry Etching (%)>

A resist film of 100 nm thick was formed over a wafer treated with hexamethyldisilazane. The film was etched using an argon/CHF₃ mixed gas at 23° C. for 30 seconds. The thickness of the resist film after the plasma etching was measured. The measured thickness after the plasma etching was divided by the thickness before etching, and then multiplied by 100, to obtain the percentage of residual film. The larger the percentage of residual film, the better the dry etching durability.

<Density of Defect During Mold Releasing>

The resist pattern was checked in the SEM image, so as to find any chipping of pattern (number of chipping/pattern).

TABLE 1

| | Benzyl-acrylate | Phenetyl acrylate | Tricyclodecane dimethanol diacrylate | Cyclohexane dimethanol diacrylate | Compound 1 | Compound 2 | (Perfluorooctyl) ethyl acrylate | ZONYL FSO100 |
|---|---|---|---|---|---|---|---|---|
| Example 1 | 76 | | 20 | | | | 2 | |
| Example 2 | 83 | | 10 | | | | 2 | |
| Example 3 | 76 | | | 20 | | | 2 | |
| Example 4 | 86 | | | 10 | | | 2 | |
| Example 5 | | 76 | 20 | | | | 2 | |
| Example 6 | 84.5 | | | 10 | | | 0.5 | |
| Example 7 | | 77.5 | | 20 | | | 0.5 | |
| Example 8 | 77.5 | | | | 20 | | 0.5 | |
| Example 9 | 77.5 | | | | | 20 | 0.5 | |
| Example 10 | 76 | | 20 | | | | | 2.0 |

TABLE 1-continued

|  | Darocur 1173 | Specific-gravity | Viscosity | Ohnishi parameter | Crosslink density | Ratio of mold filling | Percentage of residual film after dry etching(%) | Density of defect during mold eleasing |
|---|---|---|---|---|---|---|---|---|
| Example 1 | 2 | 1.08 | 14.5 | 2.9 | 1.2 | 93 | 98.5 | 1 |
| Example 2 | 5 | 1.08 | 9.4 | 2.8 | 0.6 | 95 | 98.6 | 0 |
| Example 3 | 2 | 1.07 | 4.5 | 3.0 | 1.5 | 99 | 92.0 | 2 |
| Example 4 | 2 | 1.07 | 3.7 | 2.9 | 0.7 | 98 | 91.0 | 3 |
| Example 5 | 2 | 1.04 | 6.5 | 3.0 | 1.5 | 96 | 92.3 | 2 |
| Example 6 | 5 | 1.06 | 4.3 | 2.9 | 1.1 | 99 | 91.9 | 3 |
| Example 7 | 2 | 1.03 | 6.4 | 3.0 | 1.0 | 96.5 | 92.1 | 4 |
| Example 8 | 2 | 1.06 | 7.3 | 3.0 | 1.1 | 96 | 90.3 | 6 |
| Example 9 | 2 | 1.06 | 12.3 | 2.9 | 1.0 | 92 | 90.2 | 7 |
| Example 10 | 2 | 1.07 | 14.0 | 2.9 | 1.2 | 94 | 97.0 | 0 |

TABLE 2

|  | Acryloxy-methyl pentamethyl-disiloxane | Isobornyl acrylate | Benzyl-acrylate | Tricyclo-decane dimethanol diacrylate | Ethylene glycol diacrylate | 1,9-nonane-diol diacrylate | Neopentyl glycol diacrylate | Trimethylol tripropane triacrylate | Aliphatic monofunctional urethane acrylate: GENOMER 1122 | Photomer 8127 | A-1-1 |
|---|---|---|---|---|---|---|---|---|---|---|---|
| Comparative example 1 | 37 | 42 |  |  | 18 |  |  |  |  |  |  |
| Comparative example 2 |  | 50 |  | 25 |  |  |  |  | 10 | 12 |  |
| Comparative example 3 |  | 28 |  | 7 |  | 30 | 34 |  |  |  |  |
| Comparative example 4 |  |  |  | 9 |  |  | 43 |  |  |  | 35 |
| Comparative example 5 |  |  | 67 |  |  |  |  | 29 |  |  |  |
| Comparative example 6 |  |  | 76 |  |  | 35 |  | 19 |  |  |  |
| Comparative example 7 |  |  | 95 |  |  |  |  | 0 |  |  |  |
| Comparative example 8 |  |  | 39 |  |  |  | 30 | 30 |  |  |  |
| Comparative example 9 |  |  |  | 39 |  | 40 |  | 30 | 30 |  |  |

|  | (Perfluoro-octyl) ethyl acrylate | Megafac F780F | Darocur 1173 | Lucirin TPO-L | Specific gravity | Viscosity | Ohnishi parameter | Crosslink density | Ratio of mold filling | Percentage of residual film after dry etching(%) | Density of defect during mold eleasing |
|---|---|---|---|---|---|---|---|---|---|---|---|
| Comparative example 1 |  |  | 3 |  | 0.98 | 5.1 | 3.5 | 2.2 | 98 | 85.0 | 9 |
| Comparative example 2 |  |  | 3 |  | 1.03 | 23.3 | 3.5 | 2.0 | 88 | 86.0 | 8 |
| Comparative example 3 | 21 |  | 10 |  | 1.14 | 13.4 | 3.5 | 2.7 | 94 | 85.0 | 7 |
| Comparative example 4 |  |  | 13 |  | 1.03 | 21.7 | 3.9 | 3.7 | 87 | 82.0 | 6 |
| Comparative example 5 |  |  | 5 |  | 1.05 | 4.3 | 3.2 | 2.6 | 98 | 88.0 | 4 |
| Comparative example 6 |  |  | 5 |  | 1.06 | 4.0 | 3.1 | 1.7 | 98 | 88.5 | 5 |
| Comparative example 7 |  |  | 5 |  | 1.06 | 3.4 | 2.8 | 0.0 | 98 | 94.0 | 64 |
| Comparative example 8 |  | 0.04 |  | 0.5 | 1.06 | 29.0 | 3.8 | 7.0 | 81 | 88.0 | 7 |
| Comparative example 9 |  | 0.04 |  | 0.5 | 1.08 | 52.0 | 4.0 | 9.3 | 83 | 87.5 | 8 |

In the Tables above, the specific gravity is given in g/cm³. The crosslink density is given in mmol/cm³.

As is clear from the above, the composition of the present invention was found to provide the photo-curable composition for imprints having high ratio of mold filling, high dry etching durability, and low defects during mold releasing.

The surface of the thus-obtained pattern was observed visually and under an atomic force microscope (AFM). Mark remained after ink jetting was not observed in Examples 1, 2 and 10 even under AFM. In contrast, Examples 3 to 7 showed the marks remained after ink jetting, which were not visually observable but observable under AFM. Examples 8, 9 and Comparative Examples 1 to 9 showed the marks which were visually observable.

What is claimed is:

1. A photo-curable composition for imprints comprising a monofunctional monomer which is benzyl(meth)acrylate, a polyfunctional monomer and a photo-polymerization initiator, which has a viscosity at 25° C. of 15 mPa·s or smaller, an Ohnishi parameter of 3.0 or smaller, and a crosslink density calculated by Formula (1) of 0.6 mmol/cm³ or larger;

Crosslink density={Σ(Ratio of mixing of polyfunctional monomer (parts by mass)*Number of functional groups of polyfunctional monomer/ Molecular weight of polyfunctional monomer)}/ Specific gravity,     Formula (1):

wherein the polyfunctional monomer is represented by the Formula (2) below:

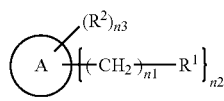

Formula (2)

wherein A represents tricyclodecane, $R^1$ represents a polymerizable group, and $R^2$ represents a substituent; n1 represents an integer of 1 to 3, n2 represents an integer of 1 to 6, and n3 represents an integer of 0 to 5; when n2 is 1, at least one of $(R^2)$s represents a polymerizable group.

2. The photo-curable composition for imprints of claim 1, wherein $R^1$ represents a (meth)acryloyloxy group.

3. The photo-curable composition for imprints of claim 1, wherein n2 represents an integer of 2 to 6.

4. The photo-curable composition for imprints of claim 1, wherein the polyfunctional monomer is tricyclodecane dimethanol di(meth)acrylate.

5. The photo-curable composition for imprints of claim 1, further comprising a fluorine atom-containing compound having a fluorine content of 10 to 70%.

6. The photo-curable composition for imprints of claim 1, wherein the fluorine-containing compound is a fluorine-containing polymer, fluorine-containing oligomer, fluorine-containing monomer, or fluorine-containing surfactant.

7. A pattern forming method comprising:
applying the photo-curable composition described in claim 1 onto a base, to thereby form a pattern-forming layer;
pressing a mold onto the pattern-forming layer; and
irradiating the pattern-forming layer with light,
or,
applying the photo-curable composition described in claim 1 onto a mold, to thereby form a pattern-forming layer;
pressing a base onto the surface of the pattern-forming layer; and
irradiating the pattern-forming layer with light.

8. A pattern obtained by using the pattern forming method described in claim 7.

9. A method of manufacturing a semiconductor device, the method comprising the pattern forming method described in claim 7.

10. A semiconductor device obtained by using the method of manufacturing a semiconductor device described in claim 9.

* * * * *